United States Patent
Arai et al.

[19]

[11] Patent Number: 5,817,366
[45] Date of Patent: Oct. 6, 1998

[54] METHOD FOR MANUFACTURING ORGANIC ELECTROLUMINESCENT ELEMENT AND APPARATUS THEREFOR

[75] Inventors: Michio Arai, Koganei; Kenji Kakaya, Yotsukaido; Kenryo Namba, Tokyo, all of Japan

[73] Assignee: TDK Corporation, Tokyo, Japan

[21] Appl. No.: 681,583

[22] Filed: Jul. 29, 1996

[51] Int. Cl.[6] .............................. B05D 5/06; C23C 16/00; C23C 14/00
[52] U.S. Cl. ..................... 427/66; 427/126.2; 427/126.3; 427/255; 427/255.7; 427/419; 427/255.5; 118/719; 118/721; 118/129; 118/20; 204/792.15; 204/192.26; 204/192.1
[58] Field of Search .................................. 427/66, 126.2, 427/126.3, 255, 255.5, 255.7, 419.3; 118/719, 223 YE, 729, 50; 204/192.15, 192.26, 192.1

[56] References Cited

U.S. PATENT DOCUMENTS

| | | | |
|---|---|---|---|
| 4,529,306 | 7/1985 | Gallego | 118/719 |
| 4,951,601 | 8/1990 | Maydan | 118/719 |
| 5,067,218 | 11/1991 | Williams | 118/719 |
| 5,076,205 | 12/1991 | Vowles | 118/719 |
| 5,259,881 | 11/1993 | Edwards et al. | 118/719 |
| 5,512,320 | 4/1996 | Turner et al. | 116/719 |

*Primary Examiner*—Janyce Bell
*Attorney, Agent, or Firm*—Seidel, Gonda, Lavorgna & Monaco, PC

[57] ABSTRACT

The present invention provides a process and apparatus for manufacturing organic electroluminescence cell, wherein the steps after formation of a transparent electrode on a substrate plate up to formation of a protective film are successively carried out in vacuum chambers which are isolated from the oxidative external atmosphere and thereafter withdrawn from the chambers into the air. A plurarity of layer portions of at least a portion of the electroluminescence cell is formed in a plurality of woriking chambers and withdrawn to the outside after formation of a protective film thereon.

12 Claims, 5 Drawing Sheets

METHOD FOR MANUFACTURING ORGANIC ELECTROLUMINESCENT ELEMENT AND APPARATUS THEREFOR

BACKGROUND OF THE INVENTION

1. Technical Field of the Invention

The present invention relates to a process and apparatus for manufacturing organic electroluminescence (hereinafter also called. "EL") cell or element, and more particularly to those wherein the steps after formation of a transparent electrode on a substrate plate up to formation of a protective film are successively carried out in vacuum chambers which are isolated from the oxidative external atmosphere and thereafter withdrawn from the chambers into the air.

2. Prior Art

Organic EL cells have attracted public attentions as new light emitting sources. The conventional method for manufacturing such organic EL elements is exemplified in FIG. 7, in which a transparent electrode 31 such as In—Sn oxide (ITO) is formed on a glass substrate plate 30 by vapor deposition or sputtering and then subjected to patterning operation. The resulting patterned transparent electrode 31 is put in a vacuum chamber and a hole injection transport layer 32, a light emitting layer 33, an electron injection layer 34, a cathode 35, a silicon layer 36, and a protective layer 37 are vapor-deposited or sputtered in this order.

Figure 7:
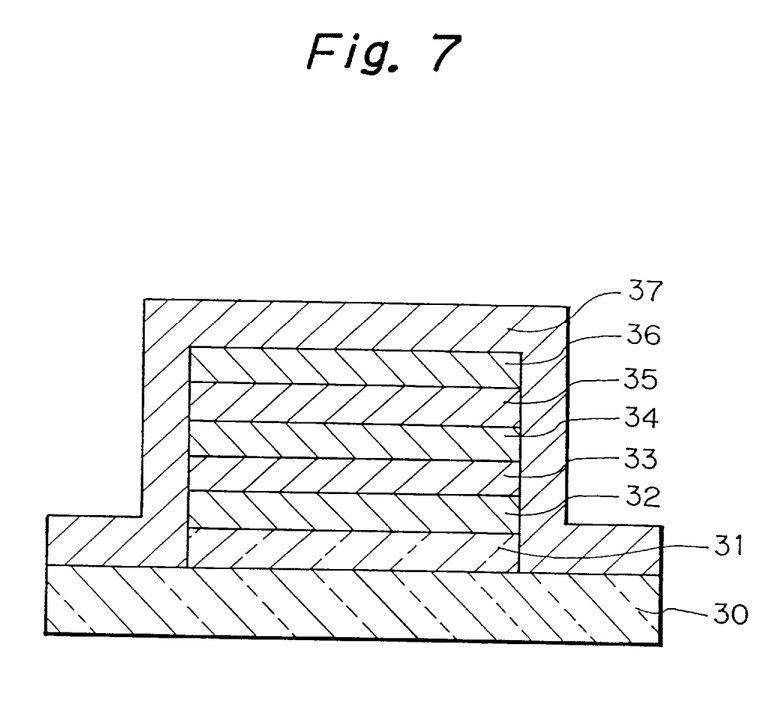
FIG. 7 illustrates a structure of a typical conventional organic EL cell.

In order to form the hole injection transport layer 32, the light emitting layer 33, the electron injection layer 34, the cathode 35, the silicon layer 36 and the protective layer 37, it was required to return the vacuum chamber to the normal pressure before each step to allow insertion of a material into the chamber which is appropriate for the step and thus there were drawbacks that the cells are exposed to an oxidizing atmosphere and required a long period of time for the production.

To solve this problem, various manufacturing systems for producing semiconductors such as organic EL cells or the like are known which comprise a plurality of vacuum chambers connected in series (in-line type).

In the in-line type systems, chambers corresponding to the number of layers to be formed are provided and arranged in the order of the steps. Even if the same materials are used for different steps the corresponding number of chambers must be provided, with the result that the systems are made large, complicated and costly.

Further, the whole in-line systems had to be shut down when any malfunction was found even only in one of the plurality of the chambers.

Furthermore, when the cells are transferred between adjacent chambers, the degree of vacuum had to be equalized between the chambers which led to a problem of long working period of time.

Incidentally, a measure can be thought of as a means of solving this problem wherein a temporary holding vacuum chamber is provided between each adjacent chambers. However, this is not practical because the number of the chambers must be increased by a number corresponding to the interfaces between the chambers, resulting in large, complicated and costly systems. If any temporary holding chambers are not used, a problem is added in that, because the materials are different from each other between the adjacent chambers, the materials are diffused as impurities to the other chamber when the EL cells are transferred between chambers, leading to shortening or fluctuation of the light emission life of the cells.

OBJECTS OF THE INVENTION

Accordingly, an object of the present invention is to provide a method and an apparatus for manufacturing organic electroluminescent elements or electroluminescence cells (EL cells), which do not require as large number of vacuum chambers as the number of layers to be formed or which does not require to arrange the chambers in series in the order of formation of the layers.

Another object of the present invention is to provide a method and an apparatus for manufacturing organic EL cells, the operation of which is not required to be shut down for repair purpose when one of the plurality of the chambers are in failure, the impaired chamber can be isolated and independently repaired.

A further object of the present invention is to provide a method and apparatus for manufacturing organic EL cells, which do not require to equalize the vacuum in adjacent chambers, whereby the working time period is reduced.

A yet another object of the present invention is to provide a method and an apparatus for manufacturing organic EL cells, in which materials or impurities in one working vacuum chamber are not introduced into other chambers as impurities and thus organic EL cells of a long life of use with less variation in quality can be produced.

SUMMARY OF THE INVENTION

To solve these problems the present invention provides a method for manufacturing organic electroluminescent elements of electroluminescence cells (organic EL cells) wherein at least a part of a plurality of layers of the cells are successively formed in a plurality of working vacuum chambers arranged around a transfer vacuum chamber and thereafter a protective layer is formed prior to withdrawal of the cells from the transfer vacuum chamber.

The present invention further provides an apparatus for manufacturing organic EL cells which comprises a transfer vacuum chamber in which retainer and transfer means is provided and a plurality of working vacuum chambers arranged around this vacuum bath, each for forming at least one of a plurality of layers of each of the organic EL cells. Each of the working vacuum chambers is connected to the transfer vacuum chamber by means of a gate valve and is isolated during each work if desired or during maintenance.

According to one aspect of the present invention, the transfer vacuum chamber is provided therein with movable arm means, the forward end of which is capable of being freely moved into each working vacuum chamber.

According to the present invention, an advantage is obtained that it is not necessary to provide chambers corresponding in number to the layers to be deposited and to arrange the working vacuum chambers in the order of deposition of the layers. In other words, the present apparatus allows a horizontally rotatable robot arm to access selected one of the working vacuum chambers in any order to carry substrate plates or organic EL wafers (intermediate products) into and out of the working vacuum chambers and those layers of the same material may be formed in the same chamber which is particularly advantageous when layers of the same material are repeatedly deposited for a cell. For example, there may be a case where a plurality of light emitting layers are deposited for a single organic EL cell to form hole injection transport layers, electron injection transport layers, or the like are respectively formed several times from the same materials. According to the present invention, the increase in the number of repetitive layers does not mean a necessity of increase in the number of chambers.

According to the present invention, failure in one of the chambers does not necessitate shut-down of the whole system for repair but an extra stand-by chamber may be used to continue the operation while the chamber of failure is isolated for repair service.

In addition, according to the present invention, when the cells are transferred from one chamber to a next adjacent chamber, there is no need to equalize the degree of vacuum between them and thus the time for working is saved.

According to the present invention, organic EL cells are produced by so called "cluster tool system" which does not require breakage of vacuum and accordingly the vacuum, once established, can be held up to the termination of the whole steps without necessity of re-establishing vacuum for each step and thus the efficiency is enhanced. Moreover, as the products are withdrawn from the chamber after they are protected with a protective layer, preventing the layers from oxidation and cells of long life of light emission may be produced.

Further, according to the present invention, respective working vacuum chambers form separate films and thus expensive organic EL materials can be recovered from the respective chambers and re-used.

Furthermore, according to the present invention organic EL wafers may be automatically transferred or carried to the working vacuum chambers to form films for efficient production of organic EL wafers.

DESCRIPTION OF PREFERRED EMBODIMENTS

Figure 1:
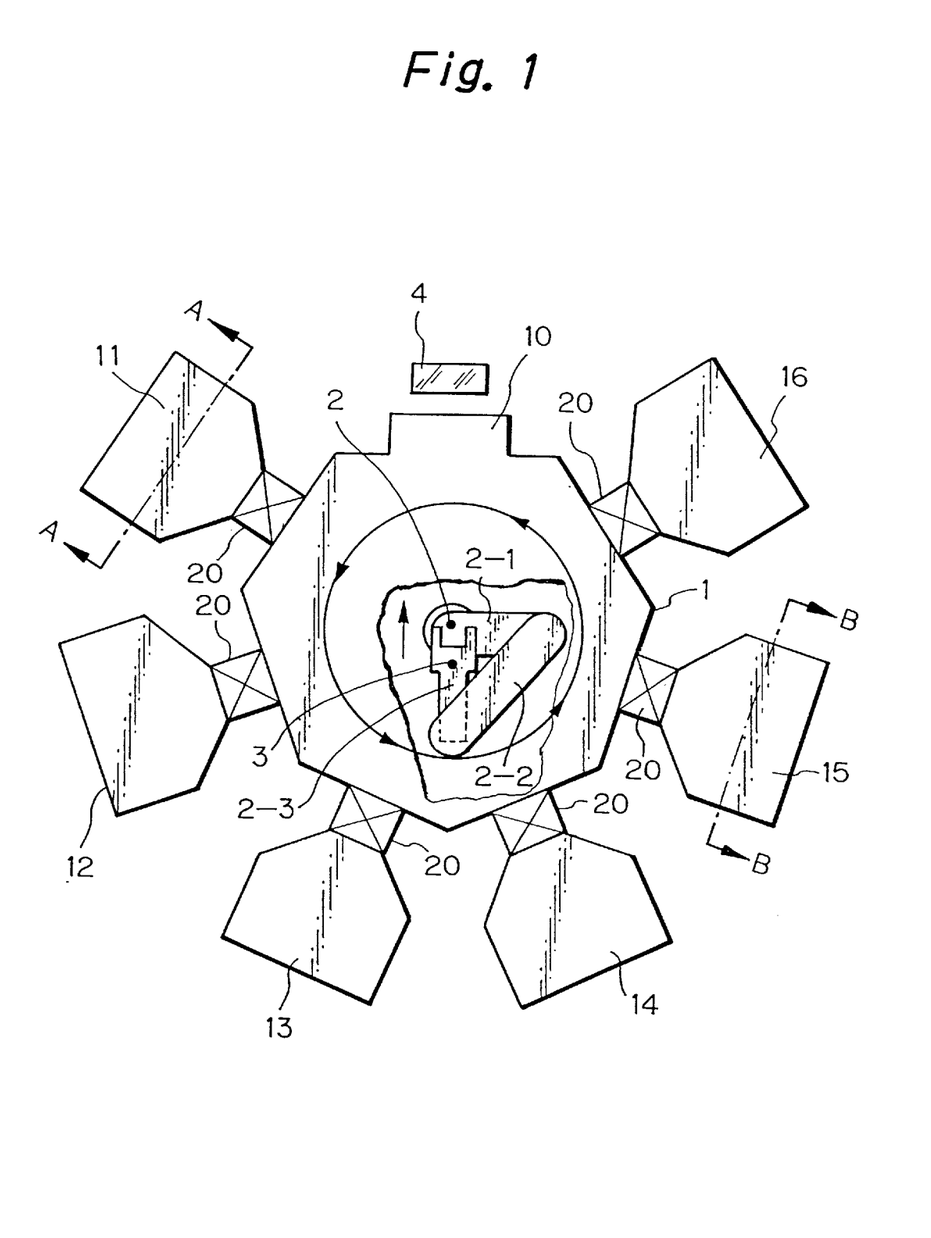
FIG. 1 is a plan view of a preferred embodiment of the apparatus according to the present invention.

In order to achieve the foregoing objects, the apparatus of the present invention includes, as shown in FIG. 1, a hollow vacuum bath 1, a holder plate insertion and withdrawal door 10 and a plurality of working vacuum chambers 11–26 along the periphery of the vacuum bath 1. A robot 2 is installed at the center within the transfer vacuum chamber 1. The robot 2 is provided with a plurality of arms, three in this example, 2-1, 2-2 and 2-3, which are vertically and horizontally extensible and rotatable and the arm 2-3 has a retainer 3 portion at its forward end.

Figure 2:
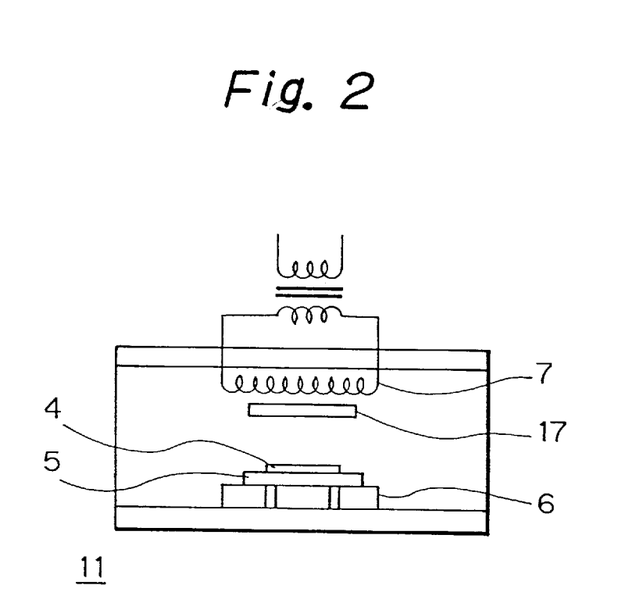
FIG. 2 is a cross sectional view of the apparatus of FIG. 1 taken along the line A—A and illustrating the case where the working vacuum chamber is a vapor-deposition chamber.

The working vacuum chambers 11–16 constitute either vapor-deposition chambers or sputtering chambers. As shown in FIG. 2, each of the vapor deposition chambers is provided with a supporting stage 6, heater means 7, a source of vapor 17 opposite to these means and other means. On the supporting stage 6 an organic EL wafer 4 is placed and a material is deposited on the wafer from the vapor source.

Figure 3:
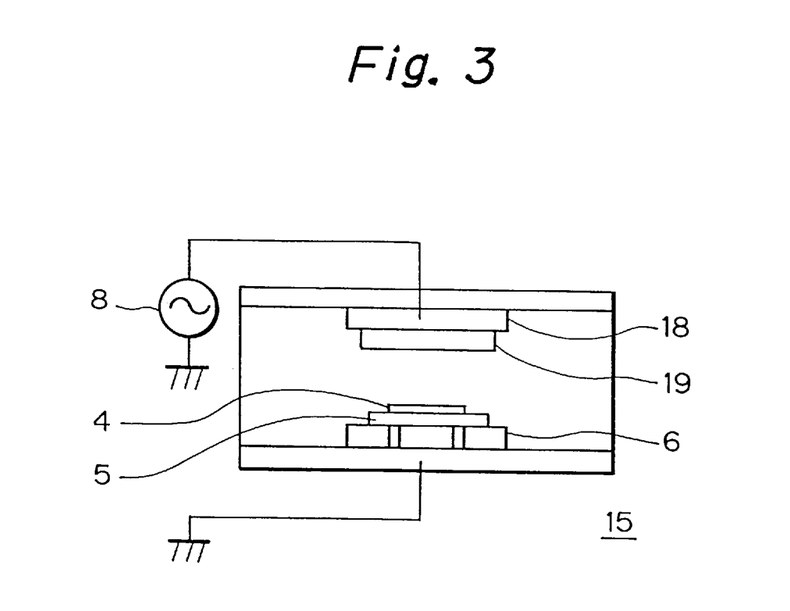
FIG. 3 is a cross sectional view of the apparatus of FIG. 1 taken along the line B—B and illustrating the case where the working vacuum chamber is a sputtering chamber.

Each of the sputtering chambers contains a supporting stage 6 and an electrode 18 opposite to the stage, and a target. The electrode 18 is connected to a high frequency source 8.

In operation, an organic EL wafer 4 consisting of a glass plate and a transparent electrode thereon which has been subjected to a patterning operation is retained on a retaining means which is then introduced into the vacuum chamber 1 through the insertion-withdrawal door 10 and retained on the retainer means 3 of the robot 2 within the vacuum chamber 11 which in turn is evacuated to create a vacuum.

The term "organic EL wafer" is defined in this specification to mean an intermediate product until a complete organic EL cell is produced. Thus, the organic EL wafer 4 shown in FIG. 1 refers to any intermediate product starting from the EL wafer consisting of a glass plate 30 and a transparent electrode 31 thereon which has been subjected to a patterning operation, via successive deposition steps in the working vacuum chambers 11–16 but prior to completion of an organic EL cell.

Then, a gate valve 20 of the transfer vacuum chamber 1 is opened, the organic wafer 4 is placed on a supporting stage 6 in the working chamber 11 and a hole injection transportation layer is vapor-deposited on the organic EL wafer 4. Then, the robot 2 moves the organic EL wafer to the working vacuum chamber 12 and places the organic EL wafer on a supporting stage 6 in the working vacuum chamber where a light-emitting layer is vapor-deposited. Subsequently, an electron injection transport layer is vapor-deposited in the working vacuum chamber 13, a cathode is vapor-deposited in the working vacuum chamber 14, a Si layer is formed b sputtering in the working vacuum chamber 15, and a protective film formed by sputtering in the working vacuum chamber 16. Thereafter, the transfer vacuum chamber 1 is returned to the normal pressure and the organic EL cells are withdrawn from the vacuum bath through the holder plate insertion-withdrawal door.

Next, one example of the present invention will be concretely described in reference to FIGS. 1–4 and 7.

First of all, method of manufacturing organic EL cells will be described in making reference to FIG. 7. The transparent electrode 31 is an anode consisting, for example, of a material such as ITO formed on a glass substrate 30 by vapor-deposition or sputtering and then shaped into a desired configuration by patterning operation to form a desired film.

The hole injection transport layer 32 includes, for example, tetra-aryl diamine derivative expressed by the following formula (1).

(1)

Wherein R1, R2, R3 and R4 respectively represent aryl, alkyl, alkoxy, aryloxy, amino, or halogen atom; r1, r2, r3 and r4 respectively represent 0 or an integer between 1 and 5; R5 and R6 respectively represent aryl, alkyl, alkoxy, aryloxy, amino, or halogen atom and they may be the same or different and r5 and r6 are respectively 0 or an integer between 1 and 4.

The hole injection transport layer 32 is not restricted to the compounds (1) but may include that formed by vapor-deposition from N,N'-di(3-methylephenyl)-N,N'-diphenyl-4,4'-diamino-1,1'biphenyl, expressed by the formula (2).

(2)

Other compounds such as aromatic tertiary amines, hydroazone derivatives, triazole derivatives, imidazole derivatives, oxadiazole derivatives, and polythiophene may be used as well.

The light-emitting layer 33 may be formed from metallic complex dyes such as tris(8-quinolinorate)aluminum; organic luminescent materials such as tetraphenylbutadiene, anthracene, perillene, coronene, 12-phthaloperinone derivatives, quinacridone, rubrene, or styryl dyes; or a mixture between a tetraaryldiamine derivative of the formula (1) for the hole injection transport layer 32 and tris(8-quinorirate)aluminum which, as will be explained later, forms an electron injection transport layer 32. In this case, co-deposition in which two different sources are evaporated is preferred but the process is not restricted to such process. Of course, luminescent materials may be contained.

The electron injection transport layer 34 may be formed by vapor deposition from metallic complex dyes such as tris(8-quinorate)aluminum, oxadiazole derivatives, perillene derivatives, pyridine derivatives, pyrimidine derivatives, quinoline derivatives, quinoxaline derivatives, diphenylquinone derivatives, nitro-substituted fluorene derivatives.

The cathode 35 is formed by sputtering or vapor-deposition from an alloy containing at least one of Li, Na, Mg, Al, Ag and In, such as Mg—Ag (10:1 by weight ratio) or Mg—In.

The Si layer 36 is formed by sputtering from Si to coat the cathode 35 with this Si layer to protect it from oxidation.

The protective layer 37 is to prevent not only the cathode 35 but also the hole injection transport layer 23 through the electron injection transport layer 34 from oxidation so as to achieve a long period of electroluminescence time of the organic EL cells. This layer is formed by sputtering $SiO_2$, $Si_3N_4$.

In the present invention, the layers beginning from the hole injection layer 32 through the protective layer 37 are formed in the order of the arrangement of the the working vacuum chambers 11–16.

The manufacturing apparatus illustrated in FIG. 1 will now be explained. In FIG. 1, 1 is a transfer vacuum chamber, 2 is a robot, 3 is a retainer, 4 is a organic EL wafer, 10 is a holder plate insertion-withdrawal door, 11–16 are working vacuum chambers and 20 are gate valves.

In the transfer vacuum chamber 1 a robot 2 is installed and a plurality of the working vacuum chambers 11–16 are arranged around the transfer vacuum chamber 1 in a cluster manner and they are connected to the transfer vacuum chamber 1 by means of gate valves 20. The vacuum bath 1 is provided with the sealable holder plate insertion-withdrawal door 10.

An organic EL wafer consisting of a glass substrate 30 and a transparent electrode 31 formed on the substrate 30 is inserted by way of the holder plate insertion-withdrawal door 10 into the vacuum chamber 1 by means of the robot 2 and then into the working vacuum chambers 11–16 in this sequence or in any predetermined order to successively form a hole injection transport layer 32, a light-emitting layer 33, an electron injection transport layer 34, a cathode 35, a Si layer 36 and a protective layer 37 to produce organic EL cells.

The robot 2 inserts the organic EL wafer 4 successively into and withdraws it from the working vacuum chambers 11–16 and for this purpose the robot is provided, for example, with three arms 2-1, 2-2 and 2-3. These arms 2-1 to 2-3 are so connected that the retainer 3 at the distal end of the arm 2-3 can be moved and rotated vertically and horizontally in all 360 degrees.

Figure 4:
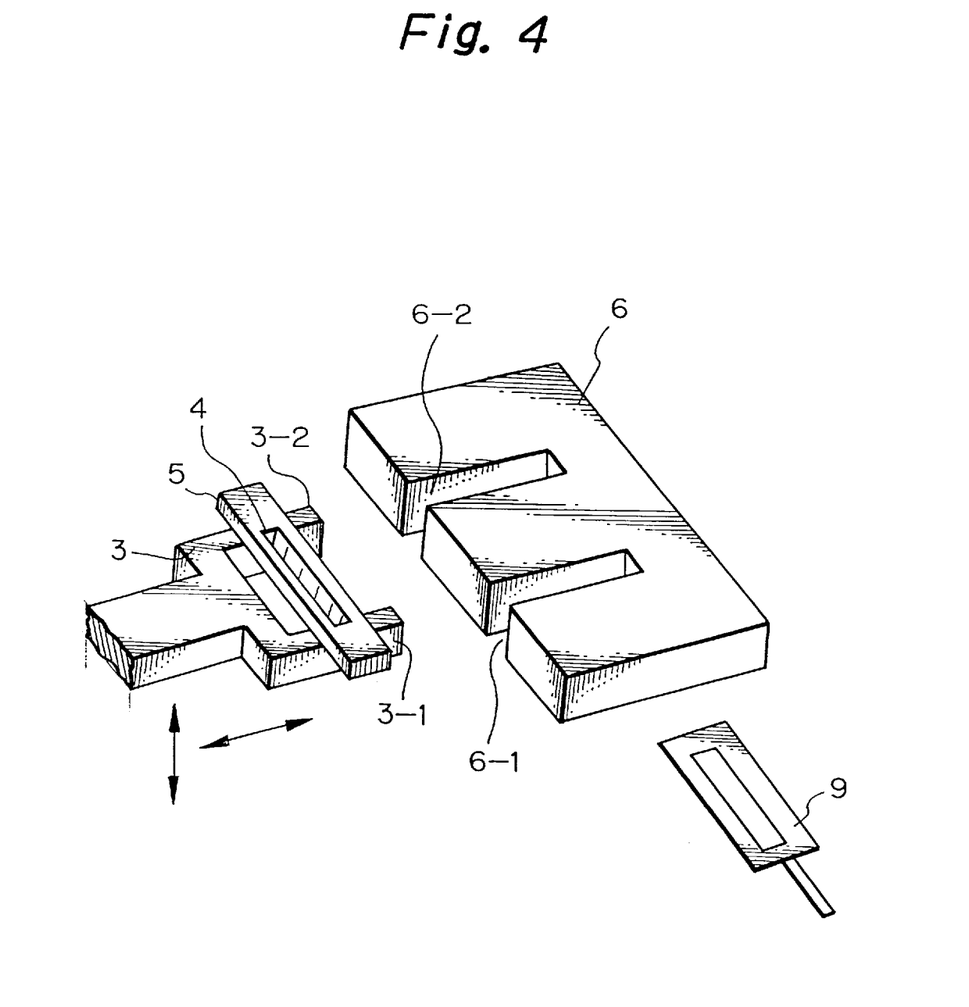
FIG. 4 is a perspective view of the holder plate and the robot arm used within the working vacuum chambers.

The retainer 3 retains the holder plate 5 on it and has projections 3-1 and 3-2 at the end of the retainer, which are adapted to be inserted into the slots 6-1 and 6-2, respectively, of the supporting stage 6 which will be explained later.

The working vacuum chamber 11 is, for example, a vacuum chamber for vapor-deposition of the hole injection transport layer 32, which is also shown by a cross section taken along the line A—A in FIG. 2. As shown in the cross sectional view, the working vacuum chamber 11 has a supporting stage 6, a heating means 7 and a vapor source 17. In the working vacuum chamber 11, the hole injection transport layer 32 is deposited with a material expressed by the formula (1) or (2).

The organic EL wafer 4 is retained on the holder plate 5 which, in turn, is placed on the supporting stage 6 which is provided with a pair of slots 6-1 and 6-2. As shown in FIG. 4, when the forward end 3 of the robot 2 moves in the right direction, the projections 3-1 and 3-2 intrude into the slots 6-1 and 6-2, respectively. Since the upper surface of the projections 3-1 and 3-2 are slightly above the surface of the supporting stage 6, the holder plate 5 is carried along the upper surface of the supporting stage 6. When the holder plate 5 is brought to a desired position, the forward end 3 is lowered so that the holder plate 5 is placed in position on the supporting stage 6.

In this position, the gate valve 20 is closed and a current is passed through the heater 7, and thus a film is deposited on the organic EL wafer 44 from the vapor source 17. After completion of the deposition, the gate valve 20 is opened again and the forward end projections 3-1 and 3-2 of the robot 2 is advanced into the slots 6-1 and 6-2 respectively in a condition that the upper surface of the projections 3-1 and 3-2 is below the upper surface of the supporting stage 6. When they advanced to a desired position, the forward end 3 is slightly raised to place the thusly deposited organic EL wafer 4 on the forward end 3 again. The organic EL wafer is moved to the outside of the working vacuum chamber 11 and then carried into the next working vacuum chamber 12 where the wafer is similarly placed on a supporting stage 6. In such manner, film formation can be performed in the subsequent working vacuum chambers. If desired, a mask 9 may be provided as shown in FIG. 4 and a masking deposition may be effected. The working vacuum chamber 12 is used to deposit a light emitting layer 33, the working vacuum chamber is to deposit an electron injection transport layer 34, the working vacuum chamber 14 is to deposit a cathode 25 which are of similar construction to the working vacuum chamber 11.

The working vacuum chamber 15 is a vacuum chamber for sputtering operation in which a Si layer 36 is formed by sputtering and FIG. 3 is a cross sectional view taken along the line B—B of FIG. 1. As shown in this cross sectional view, the working vacuum chamber 15 for sputtering, too, is provided with a supporting stage 6 as in the working chambers for vapor-deposition. An electrode 18 is disposed above the stage and a target 19 is disposed on its surface. A high frequency voltage is applied to this electrode 18 from the high frequency source 8, so that the target is sputtered with the high frequency discharge to form a Si layer 36 on the organic E1 wafer supported on the supporting stage 6 while Ar gas is introduced in this chamber.

The working vacuum chamber 16 is a vacuum chamber for sputtering operation in which a protective film 37 is formed by sputtering and has a construction similar to the working vacuum chamber 15.

Incidentally, the working vacuum chamber 11–14 and the working vacuum chamber 15 and 16 are arranged around the transfer vacuum chamber, namely in a so-called clustered fashion.

In operation, an organic EL wafer 4 consisting of a glass substrate 30 and a transparent electrode 31 thereon is first retained on a holder 5 and is first inserted through the window of the holder plate insertion and withdrawal door 10 into the transfer vacuum chamber 1 and is placed on the forward end 3 of the robot 2. Then, the gate valves 20 of the respective working vacuum chamber 11–16 are opened and the transfer vacuum chamber 1 is evacuated by a vacuum pump (not shown).

When they are reduced to a desired pressure, the forward end 3 of the robot 2 is inserted into the chamber 11 and the holder plate 5 on which the organic EL wafer 4 is held is inserted into the working vacuum chamber 11 and placed on the supporting stage 6 of the chamber and then the gate valve 16 is closed. Thereafter, the heater 7 is heated and a hole injection transport layer 32 is vapor-deposited from the vapor source 17.

After the formation of the hole injection transport layer 32, the gate valve 20 of the working vacuum chamber 11 is opened and the forward end 3 of the robot 2 is driven to transfer the holder plate 5, which carries the organic EL wafer 4 having the hole injection transport layer 32, to the next working vacuum chamber 12. The holder plate 5 is then placed on a supporting stage 6 in the working vacuum chamber 12 and a gate valve 20 for the chamber is closed. Its heater 7 is heated to deposit a light-emitting layer 33 from the vapor source 17.

After the formation of the light-emitting layer, the gate valve 20 for the working vacuum chamber 12 is opened and the forward end 3 of the robot 2 is driven to transfer the holder plate 5, on which the organic EL wafer 4 having the hole injection transport layer 32 and the light-emitting layer 33 is held, to the next working vacuum chamber 13 and place it on a supporting stage within the chamber and its gate valve 20 is closed. Its heater 7 is heated to deposit an electron injection transport layer 34 is deposited on the organic EL wafer 4.

After the electron injection transport layer 34 is formed, the gate valve 20 for the working vacuum chamber 13 is opened and the forward end 3 of the robot 2 is driven to transfer the holder plate 5, on which the organic EL wafer 4 having the electron injection transport layer 34 is held, to the next working vacuum chamber 14 and place it on its supporting stage 6 and its gate valve 20 is closed. Its heater 7 is heated to deposit a cathode layer 35 from a vapor source 17.

After the cathode layer 35 is formed, the gate valve 20 for the working vacuum chamber 14 is opened and the forward end 3 of the robot 2 is driven to transfer the holder plate 5, on which the organic EL wafer 4 having the cathode layer 35 is held, to the next working vacuum chamber 15 and place it on its supporting stage 6 and its gate valve 20 is closed. Then, a high frequency is applied to its electrode 18 to generate a high frequency discharge so as to cause sputtering of its target 19 to form a Si layer 36 of the organic EL wafer 4.

After the Si layer 36 is formed, the gate valve 20 for the working vacuum chamber 15 is opened and the forward end 3 of the robot 2 is driven to transfer the holder plate 5, on which the organic EL wafer 4 having the Si layer 36 is held, to the next working vacuum chamber 16 and place it on its supporting stage 6 and its gate valve 20 is closed. Then, a high frequency is applied to its electrode 18 to generate a high frequency discharge so as to cause sputtering of its target 19 to form a protective layer 36 of the organic EL wafer 4.

After the formation of the protective film 37, the gate valve 20 for the working vacuum chamber 16 is opened and the forward end 3 of the robot 2 is driven to transfer the holder plate 5, on which the organic EL wafer 4 having the protective layer 36 is held, to the holder plate insertion-withdrawal door 10. Then, the transfer vacuum chamber 1 is returned to the normal pressure and a window (not shown) is opened through which the organic EL cells are withdrawn.

Figure 5:
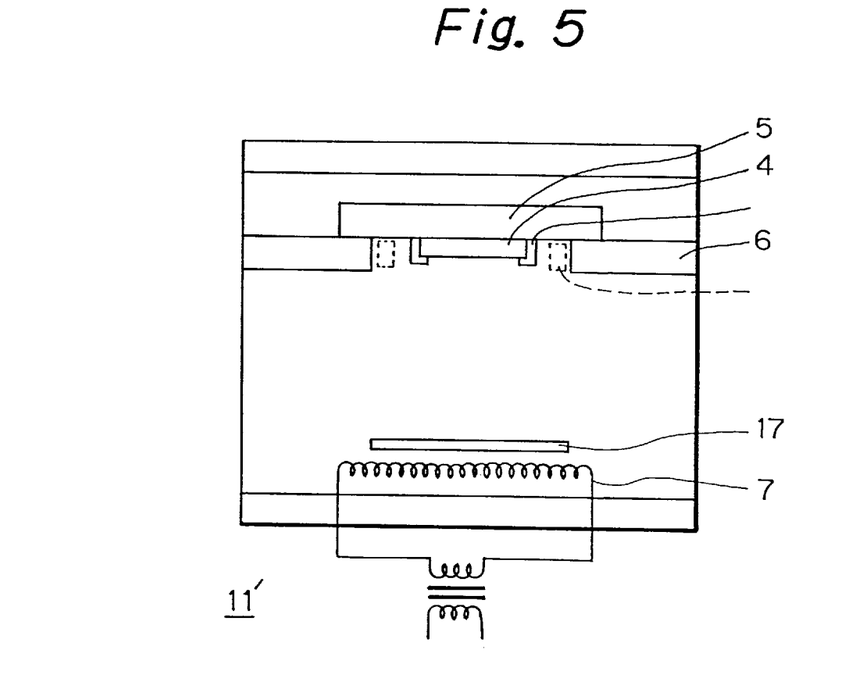
FIG. 5 is a cross sectional view of another embodiment of the working vacuum chamber according to the present invention similar to the cross section taken along the line A—A in FIG. 1.

The above embodiment was described in connection with the working vacuum chambers which have stages are positioned in the lower portion of the chambers. However, it should be noted that the present invention is not restricted to such embodiment but may include the case where, as shown in FIG. 5 as a representative working vacuum chamber 11', a heater portion 7 for deposition and a vapor source 17 may be positioned in the lower portion of the chamber and a supporting stage 6 may be positioned in the upper portion of the chamber. In such case, a plurality of pawls 21 are provided to support the edges of the substrate 4. It is noted that the portions indicated by chained lines are the portions into which the projections 3-1 and 3-2 intrude.

Figure 6:
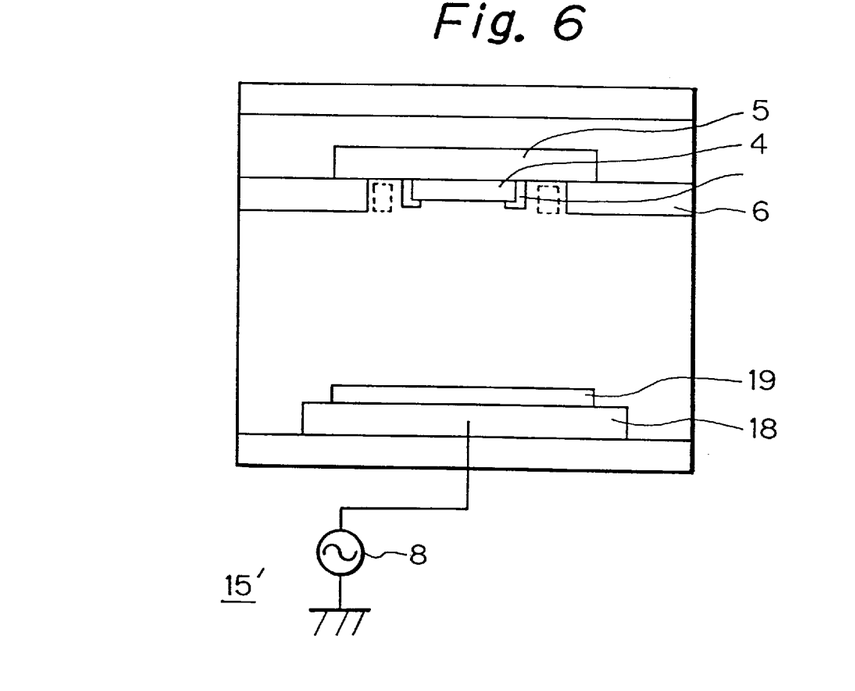
FIG. 6 is a cross sectional view of another embodiment of the working vacuum chamber according to the present invention similar to the cross section taken along the line B—B in FIG. 1.

Similarly, as a working vacuum chamber 15' for sputtering, an electrode 18 and a target 19 may be positioned in the lower portion of the chamber and the supporting stage 6 may be positioned in the upper portion of the chamber.

In such case, the organic EL wafer 4 is facing to the vapor source 17 or the target 19 and the supporting stage 6 has slots beneath the mounting portion of the organic EL wafer 4.

Although the embodiments are described which produce organic EL cells which include three layers, namely, hole injection transport layer, light-emitting layer and electron injection transport layer, the present invention is not restricted to these embodiments. For example, the present invention is applicable to the case where hole injection transport layer/light-emitting layer+electron injection transport layer; or hole injection transport layer+electron-emitting layer/electron injection transport layer is formed. Also, the present invention is applicable to the case where a single electron injection transport layer can serve both as a light-emitting layer and hole injection transport layer as well.

Further, although the arrangement of the working vacuum chambers was described as being counterclockwise in the sequence of the workings in the embodiments, it should be understood that the arrangement of the chambers is not restricted to such case but may be arbitrarily selected. In this case, the robot 2 transfers the organic E1 wafer to respective destinations in the order of the workings and even clockwise movement is acceptable.

Also, the number of the working vacuum chambers is not restricted to that shown in FIG. 1. For example, the number of the steps is increased due to the increase in the number of the layers it may be correspondingly increased.

Also, in the above explanation, a Si film is formed on a cathode and then a protective film on it. However, the present invention is not restricted to such case but can of course be applied to other constructions.

In producing organic EL cells which hate inclusion of impurities such as $H_2O$, $O_2$, CO and $CO_2$, since the present invention manufactures organic EL cells by means of the so-called cluster tool system which does not break the vacuum, the vacuum is maintained once it is established until the end of all steps is reached and accordingly the present system is efficient as there is no need of establishing a vacuum condition for each step. In addition, the organic EL cells are withdrawn to the atmosphere after a protective film is formed and accordingly each layer is not exposed to the oxidant atmosphere in producing organic EL cells which hate inclusion of impurities such as $H_2O$, $O_2$, CO and $CO_2$, and thus products of a long light-emitting life are provided.

Moreover, according to the present invention, respective working vacuum chambers form separate films and accordingly expensive materials for organic EL materials can be recovered from each vacuum chamber for re-use. The present invention in claim 3 can automatically transfer organic EL wafers and form films to efficiently produce organic EL cells.

What we claim is:

1. A method of manufacturing organic electroluminescence cells, which comprises providing a transfer vacuum chamber and a plurality of working vacuum chambers arranged around the transfer vacuum chamber, each of said working vacuum chambers consisting of one selected from a sputtering chamber and a vapor-deposition chamber having a vapor source and a heating means for evaporating said vapor source, at least one of said plurality of the working chambers being said vapor-deposition chamber forming a plurality of layers of at least a portion of said cells successively in said working vacuum chambers, and forming a protective layer thereafter before withdrawing the cells from the transfer vacuum chamber.

2. A method for manufacturing organic electroluminescence cells according to claim 1, wherein said plurality of working vacuum chambers are connected only through the transfer vacuum chamber, and a gate valve is provided between said transfer vacuum chamber and each of said working vacuum chambers.

3. A method according to claim 1 wherein at least one of said plurality of working chambers is a vapor-deposition chamber having an organic vapor source and a heating means for evaporating said vapor organic source.

4. An apparatus for manufacturing organic electroluminescence cells which comprises a transfer vacuum chamber and a plurality of working vacuum chambers provided around the transfer vacuum chamber for forming a layered portion of said electroluminescence cells, each of said working vacuum chambers consisting of one selected from a sputtering chamber and a vapor-deposition chamber having a vapor source and a heating means for evaporating said vapor source, at least one of said plurality of the working chambers being said vapor-deposition chamber said transfer vacuum chamber including therein means for transferring said cells form any one of said working vacuum chambers to another said working chambers.

5. An apparatus for manufacturing organic electroluminescence cells according to claim 4, wherein said plurality of working vacuum chambers are connected only through the transfer vacuum chamber, and a gate valve is provided between said transfer vacuum chamber and each of said working vacuum chambers.

6. An apparatus for manufacturing organic electroluminescence cells according to claim 5, wherein said means for transferring said cells is a robot having arm means whose forward end is freely movable into each of said working vacuum chambers.

7. An apparatus for manufacturing organic electroluminescence cells according to claim 6, wherein each of said working vacuum chambers is so constructed to deposit at least one layer in said layered portion of said organic electroluminescence cells.

8. A method of manufacturing organic electroluminescence cells, which comprises providing a transfer vacuum chamber and a plurality of working vacuum chambers arranged around the transfer vacuum chamber, said plurality of the working vacuum chambers comprising a plurality of vapor deposition chambers each having an organic vapor source and a heating means for evaporating said organic vapor source, forming a plurality of layers of at least a portion of said cells successively in said working vacuum chambers, and forming a protective layer thereafter before withdrawing the cells from the transfer vacuum chamber.

9. A method of manufacturing organic electroluminescence cells, which comprises providing a transfer vacuum chamber and a plurality of working vacuum chambers arranged around a vacuum bath, said plurality of the working vacuum chambers comprising a plurality of vapor deposition chambers each having an organic vapor source and a heating means for evaporating said organic vapor source, forming a plurality of layers of at least a portion of said cells successively in said working vacuum chambers, and forming a protective layer thereafter before withdrawing the cells from the transfer vacuum chamber.

10. An apparatus for manufacturing organic electroluminescence cells which comprises a transfer vacuum chamber and a plurality of working vacuum chambers provided around the transfer vacuum chamber for forming a layered portion of said electroluminescence cells, said plurality of said working vacuum chambers comprising at least one vapor-deposition chamber having an organic vapor source and a heating means for evaporating said organic vapor source, said transfer vacuum chamber including therein means for transferring said cells from any one of said working vacuum chambers to another of said working chambers.

11. An apparatus for manufacturing organic electroluminescence cells which comprises a transfer vacuum chamber and a plurality of working vacuum chambers provided around the transfer vacuum chamber for forming a layered portion of said electroluminescence cells, said plurality of said working vacuum chambers comprising a plurality of vapor-deposition chambers each having an organic vapor source and a heating means for evaporating said organic vapor source, said transfer vacuum chamber including therein means for transferring said cells from any one of said working vacuum chambers to another of said working chambers.

12. An apparatus for manufacturing organic electroluminescence cells according to claim 11, wherein each of said vapor-deposition chambers is so constructed to deposit an organic layer in said layered portion of said organic electroluminescence cells.

* * * * *

UNITED STATES PATENT AND TRADEMARK OFFICE
CERTIFICATE OF CORRECTION

PATENT NO. : 5,817,366
DATED : October 6, 1998
INVENTOR(S) : Arai et al.

It is certified that error appears in the above-identified patent and that said Letters Patent is hereby corrected as shown below:

Claim 8, Column 10, line 34 delete - - a plurality of - - and insert "at least one";

Claim 8, Column 10, line 35 delete - - chambers each - - and insert "chamber";

Claim 9, Column 10, line 44 delete - - a vacuum bath - - and insert "the transfer vacuum chamber - -.

Signed and Sealed this

Thirtieth Day of March, 1999

Attest:

Attesting Officer

Q. TODD DICKINSON

Acting Commissioner of Patents and Trademarks